(12) United States Patent
Liu

(10) Patent No.: US 8,742,821 B2
(45) Date of Patent: Jun. 3, 2014

(54) LEVEL SHIFTER

(75) Inventor: Yung-Yuan Liu, Kaohsiung (TW)

(73) Assignee: Orise Technology Co., Ltd., Hsinchu (TW)

( * ) Notice: Subject to any disclaimer, the term of this patent is extended or adjusted under 35 U.S.C. 154(b) by 85 days.

(21) Appl. No.: 13/104,133

(22) Filed: May 10, 2011

(65) Prior Publication Data

US 2011/0298519 A1 Dec. 8, 2011

(30) Foreign Application Priority Data

Jun. 3, 2010 (TW) .............................. 99117959 A

(51) Int. Cl.
*H03L 5/00* (2006.01)
(52) U.S. Cl.
USPC .......................................... 327/333; 326/80
(58) Field of Classification Search
USPC ......................... 327/333; 326/80, 81, 82, 68; 365/189.11
See application file for complete search history.

(56) References Cited

U.S. PATENT DOCUMENTS

| 5,191,233 A * | 3/1993 | Nakano ......................... 327/333 |
| 6,064,227 A * | 5/2000 | Saito ............................... 326/68 |
| 6,366,505 B1 * | 4/2002 | Fournel .................... 365/189.09 |
| 6,563,372 B1 * | 5/2003 | Fournel ......................... 327/543 |
| 6,642,769 B1 * | 11/2003 | Chang et al. .................. 327/333 |
| 6,731,273 B2 * | 5/2004 | Koyama et al. ............... 345/204 |
| 6,774,698 B1 * | 8/2004 | Bhattacharya et al. ........ 327/333 |
| 6,980,194 B2 * | 12/2005 | Tobita ........................... 345/100 |
| 7,068,074 B2 * | 6/2006 | Bhattacharya et al. ......... 326/63 |
| 7,348,801 B2 * | 3/2008 | Nojiri .............................. 326/81 |
| 7,397,279 B2 * | 7/2008 | Bhattacharya et al. ......... 326/80 |
| 7,414,453 B2 * | 8/2008 | Tachibana et al. ............. 327/333 |
| 7,511,555 B2 * | 3/2009 | Suzuki ........................... 327/333 |
| 7,663,423 B1 * | 2/2010 | Cheng ............................ 327/333 |

* cited by examiner

*Primary Examiner* — Thomas J Hiltunen
(74) *Attorney, Agent, or Firm* — Bacon & Thomas, PLLC

(57) ABSTRACT

The present invention provides a level shifter. In an embodiment, the level shifter includes first to sixth transistors. The first and second transistors have common control nodes coupled to a first bias voltage, receive a pair of input signals and respectively provide a first output node and a second output node. The fifth and sixth transistors have common control nodes coupled to a second bias voltage to form a current mirror. The third transistor is coupled between the first and the fifth transistors and has a control node coupled to the second output node. The fourth transistor is couple between the second and the sixth transistors and has a control node coupled to the first output node.

13 Claims, 3 Drawing Sheets

LEVEL SHIFTER

This application claims the benefit of Taiwan application Ser. No. 99117959, filed Jun. 3, 2010, the subject matter of which is incorporated herein by reference.

FIELD OF THE INVENTION

The present invention relates to a level shifter, and more particularly to a level shifter based on current driving for smaller layout area and reduced short current of level shifting.

BACKGROUND OF THE INVENTION

Level shifters, which receive and convert input signal(s) of smaller signal range to output signal(s) of larger signal range, are important blocks of interface circuits. For example, in gate driver chip for driving display panel, internal control signals inside the chip have a signal range of 0 to 3 Volts, but signals outputted to gates of display panel require a signal range of −8 to 3 Volts. For conversion between two different signal ranges, a level shifter is adopted to convert an input signal range of 0 to 3 Volts to an output signal range of −8 to 3 Volts.

Please refer to FIG. 1 illustrating a conventional shifter 10. The conventional level shifter 10 includes a pair of (p-channel MOS, Metal-Oxide-Silicon) transistors TP1, TP2 and a pair of (n-channel MOS) transistors TN1 and TN2. An input signal IN is inverted to another input signal INB by an inverter INV, wherein the input signals IN and INV have a signal range between voltages VPP and VSS. The level shifter 10 operates between voltages VPP and VGL for respectively providing output signals OUT and OUTB at nodes n2 and n1 according to the input signals IN and INB, with a signal range of the output signals OUT/OUTB expanded between voltages VPP and VGL. Gates of the transistors TP1 and TP2 respectively receive the input signals IN and INB, and gates of the transistor TN1 and TN2 are respectively coupled to the nodes n2 and n1.

In the prior art, the operation of level shifter 10 can be described as follows. For example, when the input signal IN transits from the voltage VPP to the voltage VSS, the transistor TP1 starts to turn on, and then pulls the voltage of the node n1 (i.e., the output signal OUTB) up to the voltage VPP. As the voltage of the node n1 raises, the transistor TN2 starts to turn on, and then pulls the voltage of the node n2 (the output signal OUT) down to the voltage VGL.

However, when the input signal is originally maintained at the voltage VPP, the transistor TN1 is turned on. When the input signal IN transits from the voltage VPP to the voltage VSS, the turned-on transistor TP1 has to compete against the turned-on transistor TN1. The turned-on transistor TN1 tends to keep the node n1 to the lower voltage VGL, so the transistor TP1 has to conduct more current than the transistor TN1 with better conduction for pulling the voltage of the node n1 up to the voltage VPP.

Since the transistor TP1 is a p-channel transistor, it suffers from lower current driving ability (e.g., lower carrier mobility). Therefore, a larger aspect ratio (ratio of channel width to length, W/L) is required to drive enough current against the transistor TN1. This requirement leads to a disadvantage that the layout area of the transistors TP1 and TP2, as well as the total layout area of the level shifter 10, can not be reduced.

In addition, when the transistor TP1 competes against the transistor TN1 owing to transition of the input signal IN, the large current conducted by the transistor TP1 causes a larger short current of longer duration which continues to drain power from the voltage VPP during the competition, and increases power consumption of the conventional level shifter 10.

Furthermore, in the prior art, the level shifter 10 is driven by voltage. That is, the transistors TP1 to TP2 and TN1 to TN2 operate respectively according to cross voltages between their gates and sources. Thus, circuit design must be specifically customized according to voltage ranges of the input and output signals. The circuit design has to be tailored for different applications. For example, if an application requires a level shifting from an input signal range of 0 to 3 Volts to an output signal range of −3 to 3 Volts, and another application needs a level shifting from an input signal range of 0 to 3 Volts to an output signal range of −20 to 3 Volts, the level shifter designed for former application can not be adopted for the latter application in the prior. The level shifter has to be re-designed with different parameters (e.g., larger circuit dimensions) to fit the latter application.

SUMMARY OF THE INVENTION

An object of the present invention is to provide a level shifter, outputting a first output signal and a second output signal respectively from a first output node and a second output node according to a first input signal and a second input signal, wherein the first input signal and the second input signal operating between a first voltage and a common voltage, the first output signal and the second output signal operating between a second voltage and the common voltage, the first voltage being between the second voltage and the common voltage, and the level shifter comprising: a first transistor, comprising a first primary-node, a first secondary-node and a first control node, the first primary-node receiving the first input signal, the first control node being coupled to a first bias voltage, and the first secondary-node being coupled to the first output node, wherein the first bias voltage is provided by a first current mirror; a second transistor, comprising a second primary-node, a second secondary-node and a second control node, the second primary-node receiving the second input signal, the second control node being coupled to the first bias voltage, and the second secondary-node being coupled to the second output node; a third transistor, comprising a third primary-node, a third secondary-node and a third control node, the third primary-node being coupled to the first output node, and the third control node being coupled to the second output node; a fourth transistor, comprising a fourth primary-node, a fourth secondary-node and a fourth control node, the fourth primary-node being coupled to the second output node, and the fourth control node being coupled to the first output node; a fifth transistor, comprising a fifth primary-node, a fifth secondary-node and a fifth control node, the fifth control node being coupled to a second bias voltage, the fifth secondary-node being coupled to the second voltage, and the fifth primary-node being coupled to the third secondary-node, wherein the second bias voltage is provided by a second current mirror; and a sixth transistor, comprising a sixth primary-node, a sixth secondary node and a sixth control node, the sixth control node being coupled to the second bias voltage, the sixth secondary-node being coupled to the second voltage, and the sixth primary-node being coupled to the fourth secondary-node; wherein the first transistor and the second transistor are matched, the fifth transistor and the sixth transistor are matched, when the first input signal equals the first voltage, the first output signal equals the second voltage, or when the first input signal equals the common voltage, the first output signal equals the common voltage.

Another object of the present invention is to provide a level shifter including a first current circuit, selecting to provide a first current to a first output node or a second output node according to an input signal, wherein the input signal operates between a first voltage and a common voltage, a first output signal of the first output node and a second output signal of the second output node operate between a second voltage and the common voltage, and the first voltage is between the second voltage and the common voltage; a switch circuit, comprising a first coupling node, a second coupling node, a third coupling node and a fourth coupling node, the first coupling node and the second coupling node being respectively coupled to the first output node and the second output node, the switch circuit determining whether to conduct the second coupling node to the fourth coupling node according to signal of the first coupling node, and determining whether to conduct the first coupling node to the third coupling node according to signal of the second coupling node; a second current circuit, comprising a first current node and a second current node respectively coupled to the third coupling node and the fourth coupling node, wherein when the switch circuit conducts the first coupling node to the third coupling node, the second current circuit provides a second current to the first current node, or when the switch circuit conducts the second coupling node to the fourth coupling node, the second current circuit provides the second current to the second current node; a first current mirror, coupled to the first current circuit, for controlling the first current generated by the first current circuit; and a second current mirror, coupled to the second current circuit, for controlling the second current generated by the second current circuit.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
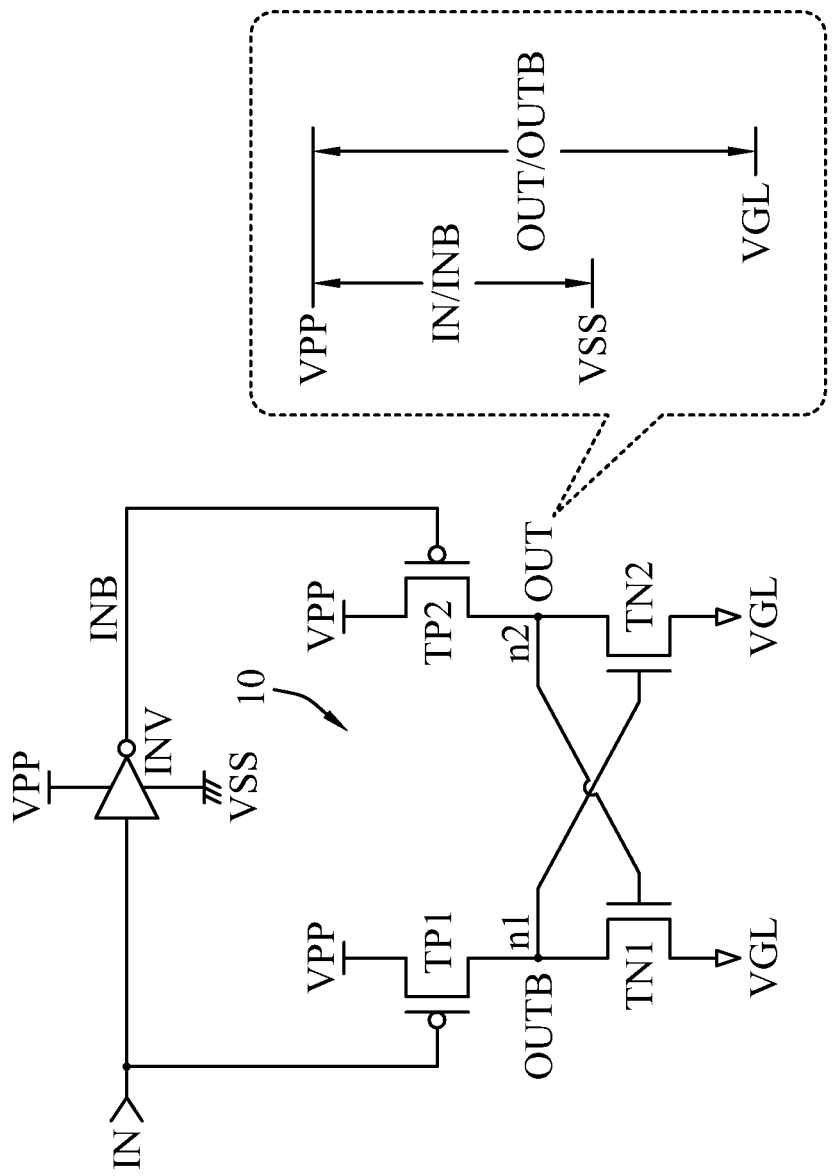
FIG. 1 (prior art) illustrates a conventional level shifter.
Figure 2:
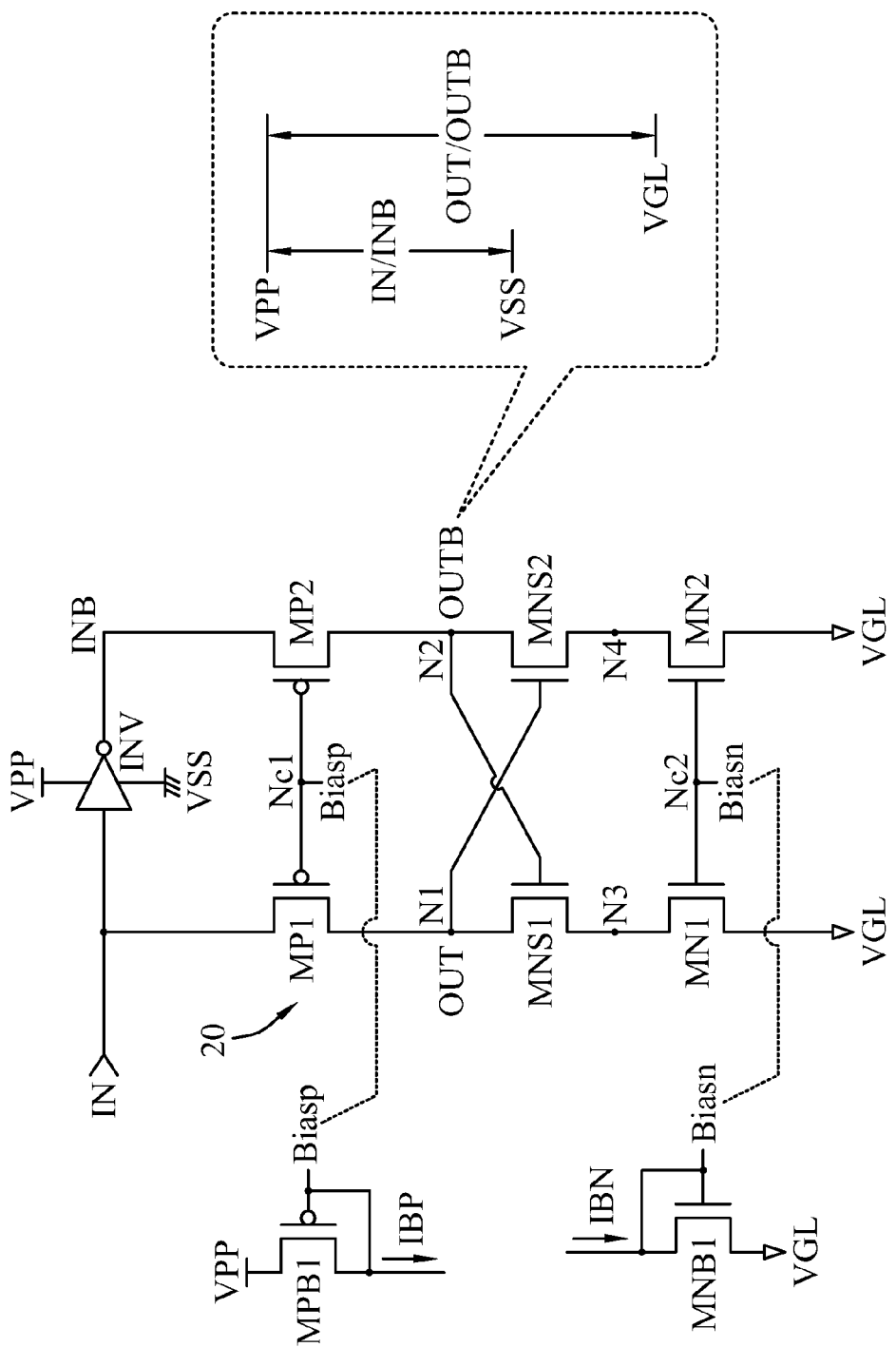
FIG. 2 illustrates a level shifter according to an embodiment of the invention.

Please refer to FIG. 2 illustrating a level shifter 20 according to an embodiment of the invention. An input signal IN is inverted to another input signal INB by an inverter INV. Both the input signals IN and INB have a signal range between voltages VPP and VSS. According to the input signals IN and INB, the level shifter 20 respectively outputs corresponding output signals OUT and OUTB to nodes N1 and N2, with a signal range of the output signals OUT and OUTB expanded between voltage VPP and VGL. The voltage VSS is between the voltages VPP and VGL. The level shifter 20 operates between the voltages VPP and VGL, and includes transistors MP1, MP2, MNS1, MNS2, MN1 and MN2 with a gate of each transistor acting as a control node, a source and a drain of each transistor acting as two other nodes. The transistors MP1 and MP2 are p-channel MOS transistors with their sources respectively receiving the input signals IN and INB, drains respectively coupled to the nodes N1 and N2 as two output nodes of the level shifter 20, and gates commonly coupled to a bias voltage Biasp at a node Nc1. The transistors MNS1 and MNS2 are n-channel MOS transistors with gates respectively coupled to the nodes N2 and N1, two other nodes of the transistor MNS1 respectively coupled to drains of the transistors MP1 and MN1 at the nodes N1 and N3, and two other nodes of the transistor MNS2 respectively coupled to drains of the transistors MP2 and MN2 at the nodes N2 and N4. The transistors MN1 and MN2 are also n-channel MOS transistors with gates commonly coupled to a bias voltage Biasn at a node Nc2 and sources commonly coupled to the voltage VGL.

In the level shifter 20, the transistors MP1 and MP2 are matched, and form a common gate structure with another transistor MPB1 (e.g., a p-channel MOS transistor) as a current mirror. The transistor MPB1 operates at the voltage VPP, wherein its gate and drain coupled together to receive bias of a current IBP, and it works as a controller of the current mirror to provide the bias voltage Biasp. The current IBP of bias can be provided by a current source (not shown). In addition, the transistors MN1 and MN2 can be matched, and form another current mirror of common gate and common source with another transistor MNB1 (e.g., an n-channel MOS transistor). With source coupled to the voltage VGL, gate and drain coupled together to receive bias of a current IBN (which can be provided by another current source not shown), the transistor MNB1 works as a controller of the current mirror to provide the bias voltage Biasn. In a preferred embodiment of the invention, amount of the current IBP is greater than the current IBN.

Operation principle of the level shifter 20 can be described as follows. When the input signals IN and INB are respectively equal to the voltages VPP and VSS, voltage at sources of the transistors MPB1 and MP1 is the voltage VPP, so the common gate structure of these two transistors mirrors the current IBP conducted by the transistor MPB1 to the transistor MP1, thus the transistor MP1 also conducts the current IBP. The conducted (turned-on) transistor MP1 pulls the voltage of the node N1 (i.e., the output signal OUT) up to the voltage VPP, and the transistor MNS2 is therefore turned on. The transistor MNS2 conducts the node N2 to the node N4, and the transistor MN2 conducts the current IBN due to the current mirror formed by the transistors MNB1 and MN2. Since the transistor MP2 is turned off with its source coupled to the lower voltage VSS of the input signal INB, the transistor MP2 will not dominate the voltage of the node N2, and the voltage of the node N2 (the output signal OUTB) is pulled down to the voltage VGL by the conducted transistor MN2 through the turned-on transistor MNS2. In this way, the output signals OUT and OUTB of the voltages VPP and VGL can be outputted in response to the input signals IN and INB of the voltages VPP and VSS. The input signal IN and the output signal OUT at the two nodes of the transistor MP1 are in-phase. That is to say, when the input signal IN reaches an upper bound of the input signal range, the output signal OUT also reaches an upper bound of the output signal range. And, when the input signal IN reaches an lower bound of the input signal range, the output signal OUT also reaches an lower bound of the output signal range. Likewise, the input signal INB and the output signal OUTB at the two nodes of the transistor MP2 are in-phase.

When the input signal IN transits from the voltage VSS to the voltage VPP so the transistor MP1 starts to conduct the current IBP, though the transistor MN1 may transiently conducts the current IBN, the voltage of the node N1 can be successfully pulled up to the voltage VPP even both the transistors MP1 and MN1 conduct, wherein the current IBP designed to be greater than the current IBN.

On a conduction path serially coupling sources and drains of the transistors MP1, MNS1 and MN1, as the voltage of the node N2 is pulled down to the voltage VGL, the transistor MNS1 will be turned off to prevent steady-state power consumption of the conduction path. On another conduction path serially coupling sources and drains of the transistors MP2, MNS2 and MN2, the transistor MP2 will prevent steady-state power consumption through the conduction path.

The above discussion describes operation of the level shifter 20 when the input signals IN and INB respectively equal the voltages VPP and VSS. When the input signals IN and INB becomes the voltages VSS and VPP, operation of the level shifter 20 can be understood by symmetry. The transistor MP2 conducts the current IBP according to the current mirror of the transistors MP2 and MPB1, so the voltage of the node N2 is raised to the voltage VPP, and the transistor MNS1 is turned on to conduct the node N1 to the node N3. The transistor MN1 conducts the current IBN according to the current mirror of the transistors MNB1 and MN1, so the voltage of the node N1 is pulled down to the voltage VGL.

From the aforementioned discussion, it is understood that the level shifter 20 of the invention operates based on principle of current driving with conductions and currents of the transistors MP1/MP2 and MN1/MN2 respectively controlled by two current mirror structures, so conduction of the transistors MP1 and MP2 can be controlled by proper design of the reference currents IBP and IBN, e.g., IBP greater than IBN, instead of increasing aspect ratio according to the prior art. Thus, layout area of the transistors MP1 and MP2, as well as total layout area of the level shifter 20, can be effectively reduced. In fact, the transistors MP1 and MP2 can be implemented with minimal dimensions allowed by layout design rules to greatly optimize layout area of the level shifter 20.

In addition, since the conducted currents of the transistors can be set by the currents IBP and IBN, amount of short current during transition can be effectively controlled to avoid transient power consumption. For example, if the current IBP is 6 Microamperes and the current IBN is 3 Microamperes, then amount of the short current will be restricted to approximate 3 Microamperes.

Furthermore, since the level shifter of the invention is driven by current instead of voltage, same circuit design (e.g., of same parameters and layout dimensions) can be generalized to different applications. For example, if an application requires level shifting from an input signal range of 0 to 3 Volts to an output signal range of −3 to 3 Volts, and another application needs level shifting from an input range of 0 to 3 Volts to an output range of −20 to 3 Volts, then a level shifter of the same design can be adopted to both applications as long as voltage tolerances of the transistors allow.

While practically implementing the level shifter 20 of the invention, a plurality of level shifters 20 can share a same transistor MPB1, also can share a same transistor MNB1. In other words, the transistors MP1 and MP2 in each of the level shifters 20 form a common gate structure with the shared transistor MPB1. One of the transistors MP1 and MP2 in each level shifter 20 completes a current mirror with the shared transistor MPB1 according to the input signals IN and INB received by each level shifter 20, so its conduction and the conducted current IBP can be generally controlled by the shared transistor MPB1. Similarly, the transistors MN1 and MN2 in each of a plurality of level shifters 20 can form a current mirror with a shared transistor MNB1, so amount of the current IBN can be controlled by the shared transistor MNB1.

Equivalently, in the level shifter 20 of the invention, the transistors MP1 and MP2 form a current circuit with the nodes N1 and N2 being two output nodes, and the current circuit selects to provide the current IBP to one of the nodes N1 and N2 according to the input signal IN (and the associated input signal INB). The transistors MNS1 and MNS2 form a switch circuit with the nodes N1 to N4 being four coupling nodes, and the switch circuit determines whether the node N2 is conducted to the node N4 according to the signal (voltage) of the node N1, also determines whether to conduct the node N1 to the node N3 according to the signal of the node N2. The transistors MN1 and MN2 form another current circuit with the nodes N3 and N4 being two current nodes. When the switch circuit formed by the transistors MNS1 and MNS2 conducts the node N1 to the node N3, the current circuit formed by the transistors MN1 and MN2 provides the current IBN to the node N3. Symmetrically, when the switch circuit conducts the node N2 to the node N4, the current circuit of the transistors MN1 and MN2 provides the current IBN to the node N4.

Figure 3:
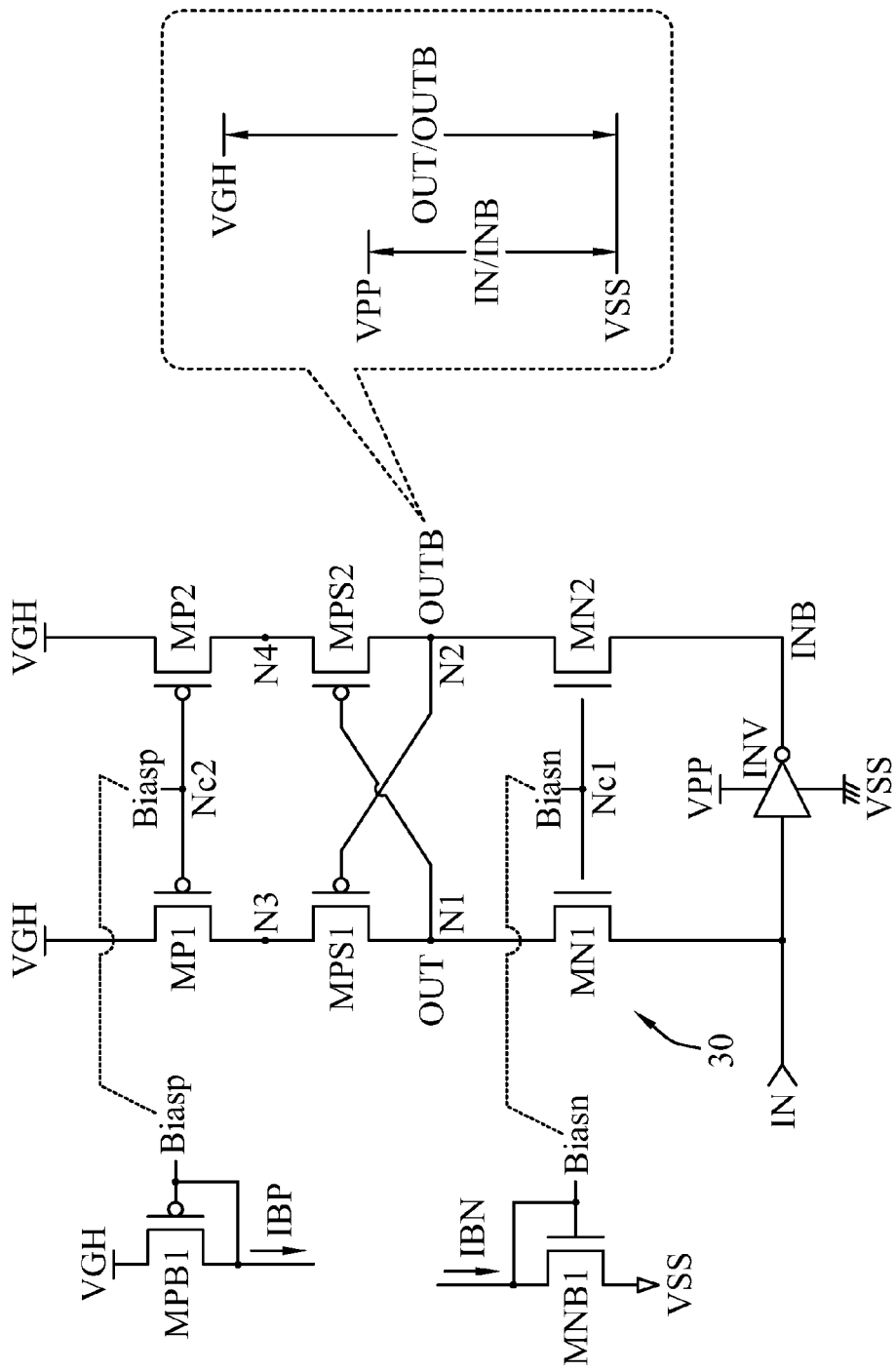
FIG. 3 illustrates a level shifter according to another embodiment of the invention.

Please refer to FIG. 3 illustrating a level shifter 30 according to another embodiment of the invention. An input signal IN is inverted to another input signal INB by an inverter INV, and both the input signals IN and INB have a signal range between voltages VPP and VSS. The level shifter 30 operates between voltages VGH and VSS, and respectively outputs output signals OUT and OUTB to nodes N1 and N2 according to the input signals IN and INB, so a signal range of the output signals OUT and OUTB is expanded between voltage VGH and VSS. The voltage VPP is between the voltages VGH and VSS.

The level shifter 30, operating between the voltages VGH and VSS, includes transistors MP1, MP2, MNS1, MNS2, MN1 and MN2 with a gate of each transistor as a control node, a source and a drain of each transistor as two other nodes. The transistors MN1 and MN2 are n-channel MOS transistors with their sources respectively receiving the input signals IN and INB, drains respectively coupled to the nodes N1 and N2 as two output nodes of the level shifter 30, and gates commonly coupled to a bias voltage Biasn at a node Nc1. The transistors MPS1 and MPS2 are p-channel MOS transistors with gates respectively coupled to the nodes N2 and N1, two other nodes of the transistor MPS1 respectively coupled to drains of the transistors MN1 and MP1 at the nodes N1 and N3, and two other nodes of the transistor MPS2 respectively coupled to drains of the transistors MN2 and MP2 at the nodes N2 and N4. The transistors MP1 and MP2 are also p-channel MOS transistors with gates commonly coupled to a bias voltage Biasp at a node Nc2 and sources commonly coupled to the voltage VGH.

In the level shifter 30, the transistors MN1 and MN2 are matched, and form a common gate structure like a current mirror with another transistor MNB1 (e.g., an n-channel MOS transistor). The transistor MNB1 operates at the voltage VSS, and its gate and drain coupled together to receive bias of a current IBN in order to work as a controller of the current mirror to provide the bias voltage Biasn. In addition, the transistors MP1 and MP2 can be matched, and form another current mirror of common gate and common source with another transistor MPB1 (e.g., a p-channel MOS transistor). Owing to source coupled to the voltage VGH, and gate and drain coupled together to receive bias of a current IBP, the transistor MPB1 works as a controller of the current mirror to provide the bias voltage Biasp. In a preferred embodiment of the invention, amount of the current IBP is less than the current IBN.

Operations of the level shifter 30 can be understood by an analogy of the level shifter 20. For example, when the input signal IN equals the voltage VSS and the input signal INB equals the voltage VPP, the transistors MN1 and MNB1 form a current mirror, so the transistor MN1 conducts the current IBN. Because the current IBN is greater than the IBP, the voltage of the node N1 (i.e., the output signal OUT) is pulled down to the voltage VSS. Consequently, the transistor MPS2 is turned on, and the current IBP conducted by the transistor MP2 pull the voltage of the node N2 (the output signal OUTB) up to the voltage VGH.

To sum up, in the level shifter 20 of the invention, the signal range upper bound of the input signals IN/INB (i.e., the voltage VPP) is a common signal range upper bound (a common voltage) of the input signals IN/INB and the output signals OUT/OUTB, and the signal range lower bound of the output signals OUT/OUTB (the voltage VGL) is lower than that of input signals IN/INB (the voltage VSS). On the other hand, in the level shifter 30 of the invention, the signal range lower bound of the input signals IN/INB (i.e., the voltage VSS) is a common lower bound (a common voltage) of the input signals IN/INB and the output signals OUT/OUTB, and the signal range upper bound of the output signals OUT/OUTB (the voltage VGH) is higher than that of input signals IN/INB (the voltage VPP). Comparing to prior art, the invention controls operation of level shifting by current driving of current mirror structures, so layout area of the invention can be effectively reduced. The transient short current and power consumption are also suppressed. In addition, the invention can generalize a same circuit to different applications. That is, there is no need to design level shifters of different sizes for different kinds of voltage level shifting. Also, the same circuit design of the invention can generally apply to different applications of voltage level shifting.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A level shifter, outputting a first output signal and a second output signal respectively from a first output node and a second output node according to a first input signal and a second input signal, wherein the first input signal and the second input signal operating between a first voltage and a common voltage, the first output signal and the second output signal operating between a second voltage and the common voltage, the first voltage being between the second voltage and the common voltage, and the level shifter comprising:

a first transistor, comprising a first primary-node, a first secondary-node and a first control node, the first primary-node receiving the first input signal, the first control node being keep at a first bias voltage, and the first secondary-node being coupled to the first output node, wherein the first bias voltage is provided by a first current mirror;

a second transistor, comprising a second primary-node, a second secondary-node and a second control node, the second primary-node receiving the second input signal, the second control node being keep at the first bias voltage, and the second secondary-node being coupled to the second output node;

a third transistor, comprising a third primary-node, a third secondary-node and a third control node, the third primary-node being coupled to the first output node, and the third control node being coupled to the second output node;

a fourth transistor, comprising a fourth primary-node, a fourth secondary-node and a fourth control node, the fourth primary-node being coupled to the second output node, and the fourth control node being coupled to the first output node;

a fifth transistor, comprising a fifth primary-node, a fifth secondary-node and a fifth control node, the fifth control node being coupled to a second bias voltage, the fifth secondary-node being coupled to the second voltage, and the fifth primary-node being coupled to the third secondary-node, wherein the second bias voltage is provided by a second current mirror; and a sixth transistor, comprising a sixth primary-node, a sixth secondary node and a sixth control node, the sixth control node being coupled to the second bias voltage, the sixth secondary-node being coupled to the second voltage, and the sixth primary-node being coupled to the fourth secondary-node;

wherein the first transistor and the second transistor are matched, the fifth transistor and the sixth transistor are matched, when the first input signal equals the first voltage, the first output signal equals the second voltage, or when the first input signal equals the common voltage, the first output signal equals the common voltage, the first current mirror comprises a seventh transistor with a drain, a gate and a source respectively coupled to a first current source, kept at the first bias voltage and kept at the common voltage;

wherein, the second current mirror comprises an eighth n-channel MOS transistor with a drain, a gate and a source respectively coupled to a second current source, the fifth control node and the second voltage, and a current of the first current source is greater than a current of the second current source.

2. The level shifter as claimed in claim 1, wherein the first transistor and the second transistor and the seventh transistor are p-channel MOS transistors, the third transistor, the fourth transistor, the fifth transistor and the sixth transistor are n-channel MOS transistors.

3. The level shifter as claimed in claim 2, wherein the common voltage is greater than the first voltage, and the first voltage is greater than the second voltage.

4. A level shifter, outputting a first output signal and a second output signal respectively from a first output node and a second output node according to a first input signal and a second input signal, wherein the first input signal and the second input signal operating between a first voltage and a common voltage, the first output signal and the second output signal operating between a second voltage and the common voltage, the first voltage being between the second voltage and the common voltage, and the level shifter comprising:

a first transistor, comprising a first primary-node, a first secondary-node and a first control node, the first primary-node receiving the first input signal, the first control node being keep at a first bias voltage, and the first secondary-node being coupled to the first output node, wherein the first bias voltage is provided by a first current mirror;

a second transistor, comprising a second primary-node, a second secondary-node and a second control node, the second primary-node receiving the second input signal, the second control node being keep at the first bias voltage, and the second secondary-node being coupled to the second output node;

a third transistor, comprising a third primary-node, a third secondary-node and a third control node, the third primary-node being coupled to the first output node, and the third control node being coupled to the second output node;

a fourth transistor, comprising a fourth primary-node, a fourth secondary-node and a fourth control node, the fourth primary-node being coupled to the second output node, and the fourth control node being coupled to the first output node;

a fifth transistor, comprising a fifth primary-node, a fifth secondary-node and a fifth control node, the fifth control node being coupled to a second bias voltage, the fifth secondary-node being coupled to the second voltage, and the fifth primary-node being coupled to the third secondary-node, wherein the second bias voltage is provided by a second current mirror; and a sixth transistor, comprising a sixth primary-node, a sixth secondary node and a sixth control node, the sixth control node being coupled to the second bias voltage, the sixth secondary-node being coupled to the second voltage, and the sixth primary-node being coupled to the fourth secondary-node;

wherein the first transistor and the second transistor are matched, the fifth transistor and the sixth transistor are matched, when the first input signal equals the first voltage, the first output signal equals the second voltage, or when the first input signal equals the common voltage, the first output signal equals the common voltage, the first current mirror comprises a seventh transistor with a drain, a gate and a source respectively coupled to a first current source, kept at the first bias voltage and kept at the common voltage;

wherein the first transistor and the second transistor and the seventh transistor are n-channel MOS transistors, the third transistor, the fourth transistor, the fifth transistor and the sixth transistor are p-channel MOS transistors, and the second current mirror comprises an eighth p-channel MOS transistor with a drain, a gate and a source respectively coupled to a second current source, the fifth control node and the second voltage;

wherein a current of the first current source is greater than a current of the second current source.

5. The level shifter as claimed in claim 4, wherein the common voltage is less than the first voltage, and the first voltage is less than the second voltage.

6. A level shifter comprising:
a first current circuit, selecting to provide a first current to a first output node or a second output node according to an input signal, wherein the input signal operates between a first voltage and a common voltage, a first output signal of the first output node and a second output signal of the second output node operate between a second voltage and the common voltage, and the first voltage is between the second voltage and the common voltage;

a switch circuit, comprising a first coupling node, a second coupling node, a third coupling node and a fourth coupling node, the first coupling node and the second coupling node being respectively coupled to the first output node and the second output node, the switch circuit determining whether to conduct the second coupling node to the fourth coupling node according to signal of the first coupling node, and determining whether to conduct the first coupling node to the third coupling node according to signal of the second coupling node;

a second current circuit, comprising a first current node and a second current node respectively coupled to the third coupling node and the fourth coupling node, wherein when the switch circuit conducts the first coupling node to the third coupling node, the second current circuit provides a second current to the first current node, or when the switch circuit conducts the second coupling node to the fourth coupling node, the second current circuit provides the second current to the second current node;

a first current mirror, coupled to the first current circuit, for controlling the first current generated by the first current circuit; and a second current mirror, coupled to the second current circuit, for controlling the second current generated by the second current circuit, wherein the first current circuit further receives a first bias voltage, the first current mirror comprises a seventh transistor with a drain, a gate and a source respectively coupled to a first current source, kept at the first bias voltage and kept at the common voltage;

wherein the first current is greater than the second current.

7. The level shifter as claimed in claim 6, wherein the first current circuit comprises:
a first transistor, comprising a first primary-node, a first secondary-node and a first control node, the first primary-node receiving the input signal, the first secondary-node being coupled to the first output node, and the first control node being kept at the first bias voltage of the first current mirror; and a second transistor, comprising a second primary-node, a second secondary-node and a second control node, the second primary-node receiving an inversion of the input signal, the second secondary-node being coupled to the second output node, and the second control node being kept at the first bias voltage.

8. The level shifter as claimed in claim 7, wherein the first transistor and the second transistor and the seventh transistor are p-channel MOS transistor.

9. The level shifter as claimed in claim 7, wherein the first transistor and the second transistor and the seventh transistor are n-channel MOS transistor.

10. The level shifter as claimed in claim 6, wherein the switch circuit comprises:
a third transistor, comprising a third primary-node, a third secondary-node and a third control node, the third primary-node being coupled to the first coupling node, the third control node being coupled to the second coupling node, and the third secondary-node being coupled to the third coupling node; and a fourth transistor, comprising a fourth primary-node, a fourth secondary-node and a fourth control node, the fourth primary-node being coupled to the second coupling node, the fourth control node being coupled to the first coupling node, and the fourth secondary-node being coupled to the fourth coupling node.

11. The level shifter as claimed in claim 6, wherein the second current circuit comprises:
a fifth transistor, comprising a fifth primary-node, a fifth secondary-node and a fifth control node, the fifth control node being coupled to the second current mirror for receiving a second bias voltage of the second current mirror, the fifth secondary-node being coupled to the second voltage and the fifth primary-node being coupled to the first current node; and a sixth transistor, comprising a sixth primary-node, a sixth secondary-node and a sixth control node, the sixth control node being coupled to the second bias voltage, and the sixth secondary-node being coupled to the second voltage and the sixth primary-node being coupled to the second current node.

12. The level shifter as claimed in claim 11, wherein the fifth transistor and the sixth transistor are n-channel MOS transistors, and the second current mirror further comprises an eighth n-channel MOS transistor with a drain, a gate and a source respectively coupled to a second current source, the fifth control node and the second voltage.

13. The level shifter as claimed in claim 11, wherein the fifth transistor and the sixth transistor are p-channel MOS transistors, and the second current mirror further comprises an eighth p-channel MOS transistor with a drain, a gate and a source respectively coupled to a second current source, the fifth control node and the second voltage.

\* \* \* \* \*